US011462883B2

(12) United States Patent
Kishi et al.

(10) Patent No.: US 11,462,883 B2
(45) Date of Patent: Oct. 4, 2022

(54) DML DRIVER

(71) Applicant: Nippon Telegraph and Telephone Corporation, Tokyo (JP)

(72) Inventors: Toshiki Kishi, Tokyo (JP); Munehiko Nagatani, Tokyo (JP); Shinsuke Nakano, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 113 days.

(21) Appl. No.: 16/971,046

(22) PCT Filed: Feb. 22, 2019

(86) PCT No.: PCT/JP2019/006770
§ 371 (c)(1),
(2) Date: Aug. 19, 2020

(87) PCT Pub. No.: WO2019/181362
PCT Pub. Date: Sep. 26, 2019

(65) Prior Publication Data
US 2021/0091533 A1    Mar. 25, 2021

(30) Foreign Application Priority Data
Mar. 20, 2018  (JP) .............................. JP2018-052366

(51) Int. Cl.
*H01S 5/042* (2006.01)
*H03K 3/037* (2006.01)

(52) U.S. Cl.
CPC ........... *H01S 5/0427* (2013.01); *H03K 3/037* (2013.01)

(58) Field of Classification Search
USPC ....................................................... 372/38.02
See application file for complete search history.

(56) References Cited

U.S. PATENT DOCUMENTS

| 9,749,059 B2 | 8/2017 | Uemura |
| 2002/0085599 A1* | 7/2002 | Schrodinger ........... H01S 5/042 372/43.01 |
| 2004/0081212 A1* | 4/2004 | Schrodinger ......... H01S 5/0427 372/38.02 |
| 2004/0101007 A1 | 5/2004 | Bozo et al. |
| 2014/0042463 A1 | 2/2014 | Uemura et al. |
| 2015/0104190 A1 | 4/2015 | Uchino et al. |

(Continued)

FOREIGN PATENT DOCUMENTS

| JP | S5739593 A | 3/1982 |
| JP | S621124 | 1/1987 |

(Continued)

OTHER PUBLICATIONS

Kishi, Toshiki, et al., "A45-mW 50-GB/s Linear Shunt LD Driver in 0.5-um InP HBT Technology," 2016, 4 pages, Kanagawa, Japan.

*Primary Examiner* — Tuan N Nguyen
(74) *Attorney, Agent, or Firm* — Slater Matsil, LLP

(57) ABSTRACT

A CMOS inverter circuit is provided as a circuit to modulate a current flowing into a laser diode on the basis of a digital signal. An amplitude of a current flowing in a PMOSFET in the CMOS inverter circuit is made to contribute to an amplitude of the current flowing into the laser diode, to reduce an input amplitude.

11 Claims, 11 Drawing Sheets

(56) References Cited

U.S. PATENT DOCUMENTS

2016/0005361 A1  1/2016  Kajiyama et al.
2016/0013614 A1  1/2016  Moto
2018/0054331 A1  2/2018  Ogata et al.

FOREIGN PATENT DOCUMENTS

| JP | S63237228 | 10/1988 |
| JP | H03262321 A | 11/1991 |
| JP | 201576581 | 3/2006 |
| JP | 201438155 | 2/2014 |
| JP | 2006508530 | 2/2014 |
| JP | 2014186116 | 2/2014 |
| JP | 2016021458 A | 2/2016 |
| JP | 2017126658 A | 7/2017 |
| JP | 2018029314 A | 2/2018 |

* cited by examiner

DML DRIVER

CROSS-REFERENCE TO RELATED APPLICATIONS

This application is a national phase entry of PCT Application No. PCT/JP2019/006770, filed on Feb. 22, 2019, which claims priority to Japanese Application No. 2018-052366 filed on Mar. 20, 2018, which applications are hereby incorporated herein by reference.

TECHNICAL FIELD

The present invention relates to a LD driver to drive laser diodes (LD), and more particularly to a DML driver to drive directly modulated lasers (DML).

BACKGROUND

Growing communication traffic in recent years leads to the demand for a larger capacity of a fiber-optic communication network. Particularly, Ethernet®, which is a main standard of an optic communication network, is being developed to realize a larger capacity. According to the development of a larger capacity, the 10 GbE and 40 GbE Ethernet standardizations are currently complete, and the 100 GbE Ethernet standardization for the purpose of a further larger capacity is almost complete.

FIG. 7 shows a schematic structure of a transmission system of "100 GBase-LR4/ER4". In this example, on the transmission side, 25 Gbps input data is converted to an optical transmission signal in a transmitter front-end flight transmitter unit) 100 that is provided for each channel, and thereafter multiplexed in a multiplexer 200 to be transmitted. In contrast, on the reception side, the optical transmission signal from the transmission side is received via an optical fiber 300, demultiplexed in a demultiplexer 400 into each channel, and thereafter converted to 25 Gbps received data in a receiver front-end flight receiver unit) 500 that is provided for each channel to be outputted.

A LD driver using a shunt circuit structure (shunt-type LD driver) was reported as a LD driver 101 that is operable at high speed with low power consumption in the transmitter front-end 100 of this transmission system (for example, see NPL 1).

FIG. 8 shows an example of the structure of a principal part of the transmitter front-end 100 using a shunt-type LD driver. This transmitter front-end 100 is equivalent to the structure of connecting the shunt-type LD driver 101 to a laser diode LD in parallel. The LD driver 101 is configured by a switch SW to turn on and off according to a digital signal $D_o$ to be input, and a current source $CS_1$ that is connected to this switch SW in series. A constant current source $CS_C$ is connected to the laser diode LD in parallel.

FIG. 9 are explanatory views of the OFF-operation of the transmitter front-end 100 shown in FIG. 8; FIG. 9(a) is an explanatory view of an equivalent circuit, and FIG. 9(b) is an explanatory view of operating characteristics. As shown in FIG. 9, when the digital signal $D_o$ turns OFF the switch SW, a current $I_o$ supplied from the current source $CS_1$ of the LD driver 101 is zero, and a LD driving current $I_{LD}$ flowing into the laser diode LD is equal to a constant current $I_{CC}$ from the constant current source $CS_C$. An optical transmission signal is outputted from the laser diode LD at optical power P corresponding to this.

FIG. 10 are explanatory views of the ON-operation of the transmitter front-end 100 shown in FIG. 8; FIG. 10(a) is an explanatory view of an equivalent circuit, and FIG. 10(b) is an explanatory view of operating characteristics. As shown in FIG. 10, when the digital signal $D_o$ turns ON the switch SW, the current $I_o$ is supplied from the current source $CS_1$ of the LD driver 101, and the LD driving current $I_{LD}$ flowing into the laser diode LD is $I_{CC}-I_o$. An optical transmission signal is outputted from the laser diode LD at the optical power P corresponding to this.

As described above, the shunt-type LD driver 101 is added to the laser diode LD in parallel to turn on/off the switch SW of the LD driver 101, which makes it possible to superimpose data on an optical transmission signal outputted from the laser diode LD as in FIGS. 9 and 10. Due to high output resistance of this shunt-type LD driver 101, the LD driver 101 is monolithically integrated with the laser diode LD, or is packaged together with the laser diode LD. Thus, there is no need of impedance matching, and operation at high speed with low power consumption is possible.

FIG. 11 shows a concrete example of the transmitter front-end 100 shown in FIG. 8. In this transmitter front-end 100, a transistor Tr is connected to the laser diode LD in parallel, and a constant current $I_{DD}$ flows to a parallel circuit of these laser diode LD and transistor Tr from a constant current source $CS_D$. The digital signal $D_o$ (level change of an input voltage Vin) is given to a gate of the transistor Tr.

In this transmitter front-end 100, when the digital signal $D_o$ to the LD driver 101 is at level "H", the transistor Tr turns ON, a current flows to the transistor Tr, and the LD driving current $I_{LD}$ flowing into the laser diode LD is $I_{DD}-I_{DRV}$.

In this transmitter front-end 100, when the digital signal $D_o$ to the LD driver 101 is at level "L", the transistor Tr turns OFF, and the LD driving current $I_{LD}$ flowing into the laser diode LD is $I_{DD}$.

In this transmitter front-end 100, a difference between the current flowing into the laser diode LD when the digital signal $D_o$ is at level "H", and the current flowing into the laser diode LD when the digital signal $D_o$ is at level "L" is a current amplitude $I_{AMP}$ of the LD driving current $I_{LD}$. In this transmitter front-end 100, the LD driver 101 is called a DML driver to drive directly modulated lasers (DML).

CITATION LIST

Non Patent Literature

[NPL1] T. Kishi, M. Nagatani, S. Kanazawa, W. Kobayashi, T. Shindo, H. Yamazaki, M. Ida, K. Kurishima, and H. Nosaka, "A 45-mW 50-Gb/s Linear Shunt LD Driver in 0.5-μm InP HBT Technology," Compound Semiconductor Integrated Circuit Symposium, 2016

SUMMARY

Technical Problem

In the transmitter front-end 100 shown in FIG. 11, however, the LD driver (DML driver) 101 modulates the current $I_{LD}$ flowing into the laser diode LD only by ON/OFF of the transistor Tr in the LD driver 101. Thus, it is necessary that an amplitude $V_{AMP}$ of the input voltage Vin (input amplitude) that is given to the transistor Tr as the digital signal $D_o$ is high. This leads to high power consumption of a driver for an earlier stage (not shown) which plays a role in giving the transistor Tr the input amplitude, and makes it difficult to say that efficient modulation is carried out.

The present invention was made to solve such a problem, and an object thereof is to provide a DML driver that can reduce an input amplitude to lead to efficient modulation.

Means for Solving the Problem

To achieve such an object, in the present invention, a DML driver (101A) to modulate a current flowing into a laser diode (LD) on the basis of a level change in a voltage (Vin) input as a digital signal ($D_o$) includes: a CMOS inverter circuit (INV) as a circuit to modulate the current flowing into the laser diode on the basis of the digital signal.

For example, the present invention includes: a signal input terminal (S0) where the digital signal is input; a first voltage application terminal (P1) where a first DC voltage ($V_{SSP}$) is applied; and a second voltage application terminal (P2) where a second DC voltage ($V_{SSN}$) is applied, the second DC voltage being lower than the first DC voltage. The CMOS inverter circuit includes: a PMOSFET ($M_1$); and a NMOSFET ($M_2$), wherein a gate of the PMOSFET and a gate of the NMOSFET are connected to the signal input terminal, a source of the PMOSFET is connected to the first voltage application terminal, a source of the NMOSFET is connected to the second voltage application terminal, and a drain of the PMOSFET and a drain of the NMOSFET are connected to an anode of the laser diode.

The present invention makes an amplitude ($I_{AMPP}$) of a current flowing in the PMOSFET ($M_1$) in the CMOS inverter circuit contribute to an amplitude ($I_{AMP}$) of a LD driving current ($I_{LD}$) flowing in the laser diode, which can lead to a reduced input amplitude ($V_{AMP}$).

In the foregoing description, components on the drawings which correspond to components of the invention are represented by reference signs with parentheses, as one example.

Effects of the Invention

As described above, according to the present invention, a CMOS inverter circuit is used as a circuit to modulate a current flowing into a laser diode on the basis of a digital signal, which can lead to a reduced input amplitude and efficient modulation.

DETAILED DESCRIPTION OF ILLUSTRATIVE EMBODIMENTS

Hereinafter the embodiments of the present invention will be described in detail based on the drawings.

Embodiment 1

Figure 1:
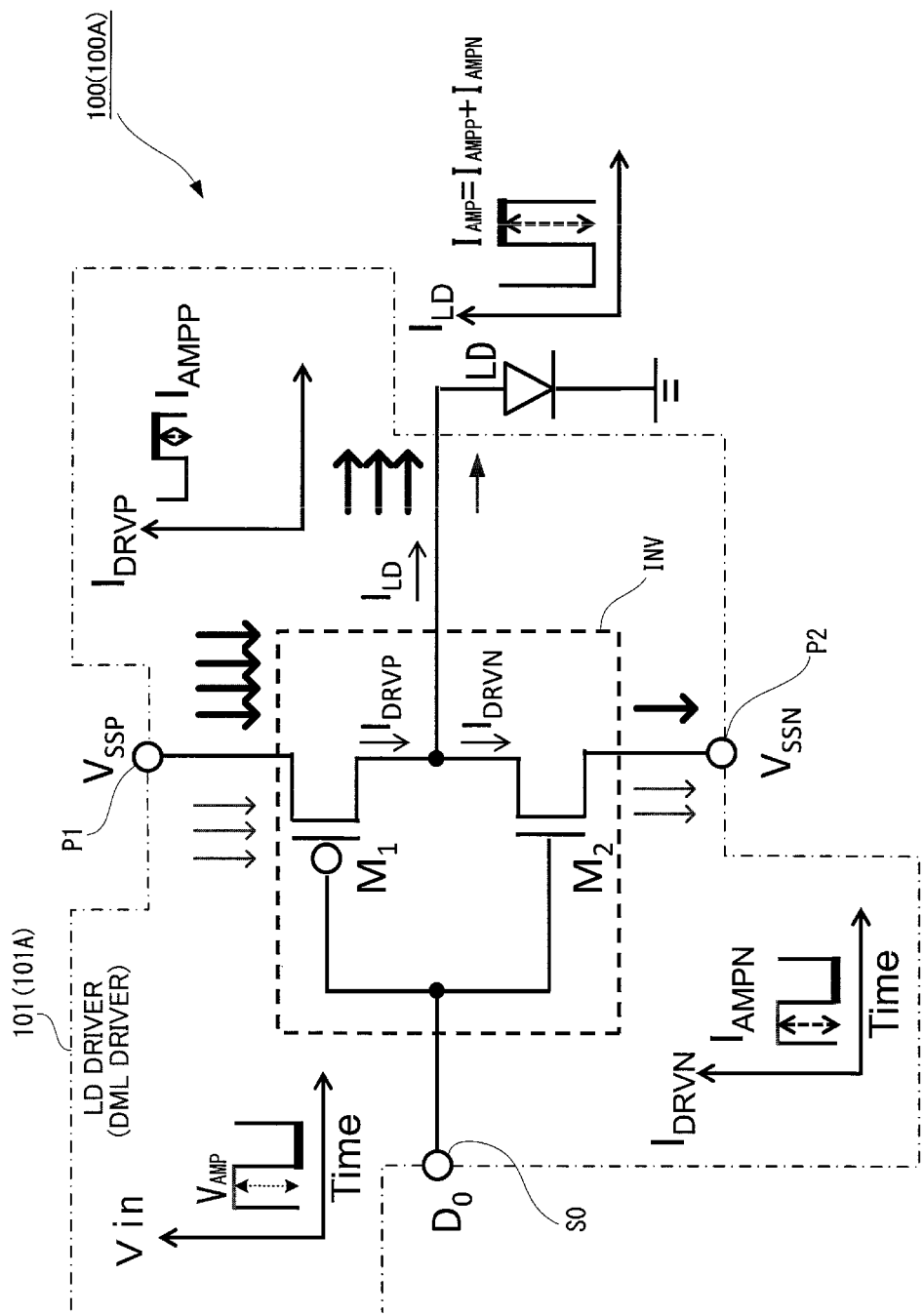
FIG. 1 is a diagram showing the structure of a principal part of a transmitter front-end using a DML driver according to Embodiment 1 of the present invention.

FIG. 1 shows the structure of a principal part of a transmitter front-end using a DML driver according to Embodiment 1 of the present invention.

In the following description, the transmitter front-end 100 of the present embodiment will be referred to as a transmitter front-end 100A, and the conventional transmitter front-end 100 shown in FIG. 11 will be referred to as a transmitter front-end 100X for distinguish the conventional transmitter front-end 100 shown in FIG. 11. Also, the LD driver 101 of the present embodiment will be referred to as a LD driver 101A, and the conventional LD driver 101 will be referred to as a LD driver 101X. Also, the LD drivers 101A and 101X will be referred to as DML drivers 101A and 101X.

In the transmitter front-end 100A shown in FIG. 1, the DML driver 101A includes a CMOS inverter circuit INV as a circuit to modulate a current flowing into a laser diode LD on the basis of a digital signal $D_o$ (level change of an input voltage Vin). The DML driver 101A also includes a signal input terminal S0 where the digital signal $D_o$ is input, a first voltage application terminal P1 where a first DC voltage $V_{SSP}$ is applied, and a second voltage application terminal P2 where a second DC voltage $V_{SSN}$ that is lower than the first DC voltage $V_{SSP}$ is applied.

The CMOS inverter circuit INV includes a PMOSFET•$M_1$ and a NMOSFET•$M_2$. A gate of the PMOSFET•$M_1$ and a gate of the NMOSFET•$M_2$ are connected to the signal input terminal S0. A source of the PMOSFET•$M_1$ is connected to the first voltage application terminal P1, a source of the NMOSFET•$M_2$ is connected to the second voltage application terminal P2, and a drain of the PMOSFET•$M_1$ and a drain of the NMOSFET•$M_2$ are connected to an anode of the laser diode LD.

In FIG. 1, $I_{DRVP}$ is a current flowing between the source and drain of the PMOSFET•$M_1$, $I_{DRVN}$ is a current flowing between the drain and source of the NMOSFET•$M_2$, and $I_{LD}$ is a current flowing into the laser diode LD (LD driving current). The relationship between the current $I_{DRVP}$ flowing in the PMOSFET•$M_1$, the current $I_{DRVN}$ flowing in the NMOSFET•$M_2$, and the current $I_{LD}$ flowing into the laser diode LD is: $I_{LD}=I_{DRVP}-I_{DRVN}$.

In the drawing, thin arrows represent the currents $I_{DRVP}$, $I_{DRVN}$, and $I_{LD}$ when the digital signal $D_o$ to the CMOS inverter circuit INV is at level "H" (input voltage Vin is at level "H"), and thick arrows represent the currents $I_{DRVP}$, $I_{DRVN}$, and $I_{LD}$ when the digital signal $D_o$ to the DML driver 101A is at level "L" (input voltage Vin is at level "L").

When the digital signal $D_o$ is at level "H", the PMOSFET•$M_1$ is in an off state and the NMOSFET•$M_2$ is in an on state, and the current $I_{DRVP}$ flowing in the PMOSFET•$M_1$ decreases and the current $I_{DRVN}$ flowing in the NMOSFET•$M_2$ increases, which leads to the current $I_{LD}$ flowing into the laser diode LD at level "L".

When the digital signal $D_o$ is at level "L", the PMOSFET•$M_1$ is in an on state and the NMOSFET•$M_2$ is in an off state, and the current $I_{DRVP}$ flowing in the PMOSFET•$M_1$ increases and the current $I_{DRVN}$ flowing in the NMOSFET•$M_2$ decreases, which leads to the current $I_{LD}$ flowing into the laser diode LD at level "H".

The NMOSFET•$M_2$ turns on to reduce the current $I_{LD}$ flowing into the laser diode LD, and the NMOSFET•$M_2$ turns off to increase the current $I_{LD}$ flowing into the laser diode LD. Thus, for the laser diode LD, the PMOSFET•$M_1$ and the NMOSFET•$M_2$ are different from each other in state according to the state of the input voltage Vin, but function the same.

Thus, when the amplitude of the current $I_{DRVP}$ flowing in the PMOSFET•$M_1$ is defined as $I_{AMPP}$, and the amplitude of the current $I_{DRVN}$ flowing in the NMOSFET•$M_2$ is defined as $I_{AMPN}$, the amplitude $I_{AMP}$ of the current $I_{LD}$ flowing into the laser diode LD is $I_{AMPP}+I_{AMPN}$, that is, the total of the amplitude $I_{AMPP}$ of the current $I_{DRVP}$ flowing in the PMOSFET•$M_1$, and the amplitude $I_{AMPN}$ of the current $I_{DRVN}$ flowing in the NMOSFET•$M_2$ is the amplitude $I_{AMP}$ of the current $I_{LD}$ flowing into the laser diode LD.

Figure 11:
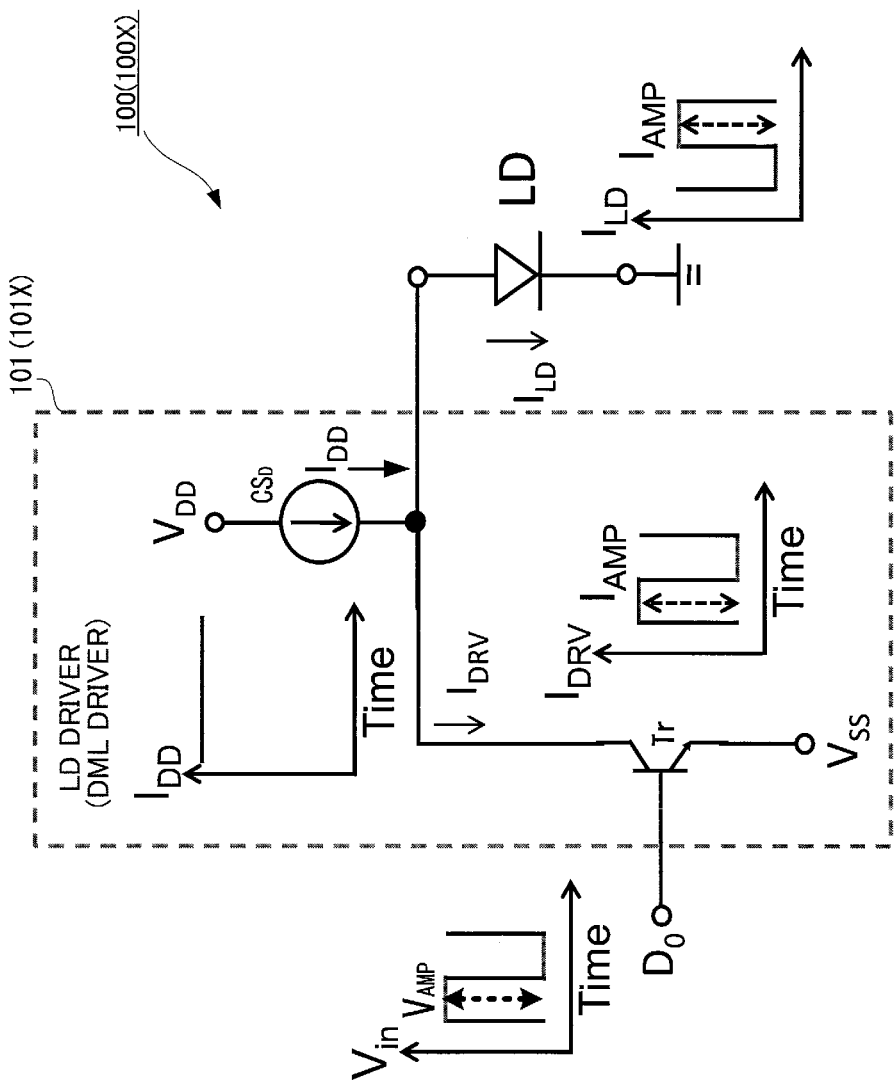
FIG. 11 is a diagram illustrating a concrete example of the transmitter front-end shown in FIG. 8.

Here, the DML driver 101A will be compared with the conventional DML driver 101X shown in FIG. 11. When the conventional DML driver 101X is used, a current $I_{DD}$ corresponding to the current $I_{DRVP}$ flowing in the PMOSFET•$M_1$ takes a fixed value, and only the current $I_{DD}$ contributes to the amplitude $I_{AMP}$ of the current $I_{LD}$ flowing into the laser diode LD. In contrast, when the same amplitude $I_{AMP}$ is to be obtained, in the DML driver 101A of the present embodiment, the amplitude $I_{AMPP}$ of $I_{DRVP}$ flowing in the PMOSFET•$M_1$ contributes to the amplitude $I_{AMP}$ of the current $I_{LD}$ flowing into the laser diode LD, which makes it possible to reduce the amplitude $V_{AMP}$ of the input voltage Vin.

As can be seen from the foregoing description, using the DML driver 101A of the present embodiment can lead to the input voltage Vin of a lower amplitude $V_{AMP}$ (input amplitude) than using the conventional DML driver 101X, and obtainment of the amplitude $I_{AMP}$ of the LD driving current $I_{LD}$ same as that of the conventional DML driver 101X. This makes efficient modulation possible. The DML driver 101A of the present embodiment does not need any separate device such as "bias T".

Embodiment 2

Figure 2:
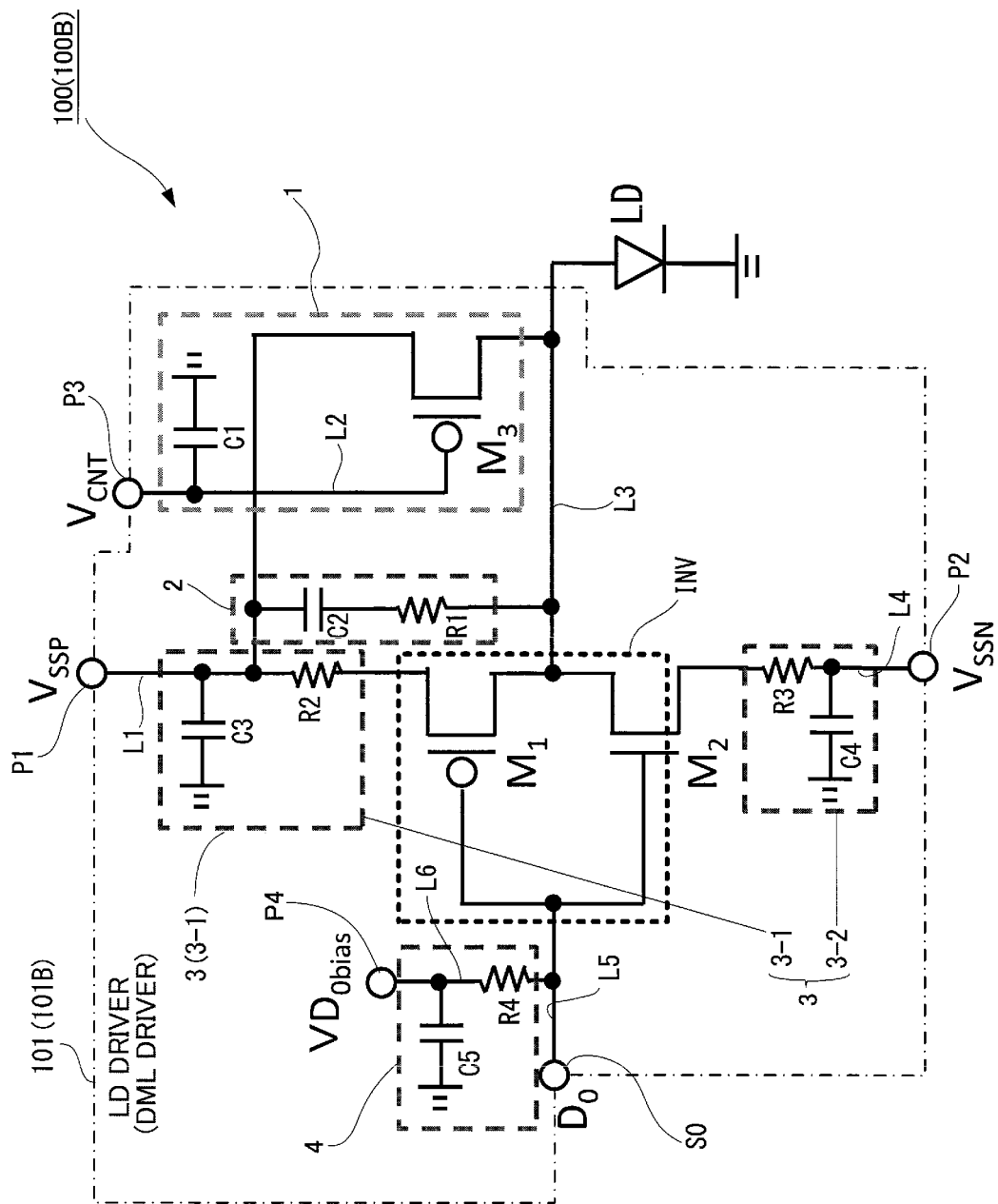
FIG. 2 is a diagram showing the structure of a principal part of a transmitter front-end using a DML driver according to Embodiment 2 of the present invention.

Next, FIG. 2 shows the structure of a principal part of a transmitter front-end using a DML driver according to Embodiment 2 of the present invention. In this transmitter front-end 100B of Embodiment 2, a first circuit 1, a second circuit 2, third circuits 3 (3-1, 3-2), and a fourth circuit 4 are added to a DML driver 101B as a new circuit structure.

The DML driver 101B also includes a third voltage application terminal P3 where a third DC voltage $V_{CNT}$ is applied, and a fourth voltage application terminal P4 where a fourth DC voltage $VD_{obiaS}$ is applied, in addition to the first voltage application terminal P1 where the first DC voltage $V_{SSP}$ is applied, and the second voltage application terminal P2 where the second DC voltage $V_{SSN}$ that is lower than the first DC voltage $V_{SSP}$ is applied.

In the DML driver 101B, the first circuit 1 is configured by a PMOSFET•$M_3$ to supply a bias current to the laser diode LD, and a capacitor C1 (decoupling capacitor). Adding this first circuit 1 makes it possible to operate the DML driver 101B in the linear regime.

In the first circuit 1, a gate of the PMOSFET•$M_3$ is connected to the third voltage application terminal P3, a source thereof is connected to a connection line L1 connecting the source of the PMOSFET•$M_1$ and the first voltage application terminal P1, and a drain thereof is connected to the anode of the laser diode LD. The capacitor C1 links a connection line L2 connecting the third voltage application terminal P3 and the gate of the PMOSFET•$M_3$, and a grounded line.

The PMOSFET•$M_3$ of the first circuit 1 is turned on, which can lead to the supply of the bias current to the laser diode LD. A bias voltage of $D_o$ is increased to operate the NMOSFET•$M_2$ in the linear regime, which can lead to the operation of the DML driver 101B in the linear regime. The bias voltage of $D_o$ is increased, which leads to the PMOSFET•$M_1$ in the off state, but the bias current from the PMOSFET•$M_3$ of the first circuit 1 to the laser diode LD is supplied. Adjustment of $V_{CNT}$ can adjust the linearity of the driver.

The second circuit 2 is configured by a resistor R1 and a capacitor C2 which are connected in series, to function as a RC filter to suppress overshoots in the light output waveform. In this second circuit 2, a series-connected circuit of the resistor R1 and the capacitor C2 links a connection line L3 connecting the drain of the PMOSFET•$M_1$, the drain of the NMOSFET•$M_2$, and the anode of the laser diode LD, and the connection line L1 connecting the source of the PMOSFET•$M_1$ and the first voltage application terminal P1. When the PMOSFET•$M_1$ turns on, the current to the laser diode LD increases, and an overshoot is seen in the light output waveform of the laser diode LD. Addition of the second circuit 2 for preventing eye patterns of the light output from deteriorating due to the influence of overshoots can suppress overshoots by the effect of the RC filter.

The third circuits 3 (3-1, 3-2) are configured by a resistor R2 connected between the source of the PMOSFET•$M_1$ and the first voltage application terminal P1, a capacitor C3 connected between the grounded line and the connection line L1 connecting the first voltage application terminal P1 and the resistor R2, a resistor R3 connected between the source of the NMOSFET•$M_2$ and the second voltage application terminal P2, and a capacitor C4 connected between the grounded line and a connection line L4 connecting the second voltage application terminal P2 and the resistor $R3_1$. The third circuits 3 (3-1, 3-2) have the function of suppressing resonances in a power line, and can suppress an impedance change of a power source due to LC resonance of a parasitic capacitance and a parasitic inductor component on the power line.

The fourth circuit 4 is an input bias supplying part to the DML driver 101B, and is configured by a resistor R4 that links a connection line L5 connecting the gate of the PMOSFET•$M_1$, the gate of the NMOSFET•$M_2$ and the signal input terminal S0, and the fourth voltage application terminal P4, and a capacitor C5 that links a connection line L6 connecting the fourth voltage application terminal P4 and the resistor R4, and a grounded line. The fourth circuit 4 matches the resistor R4 to the impedance of an input line, to also play a role as an input matching part.

Figure 3:
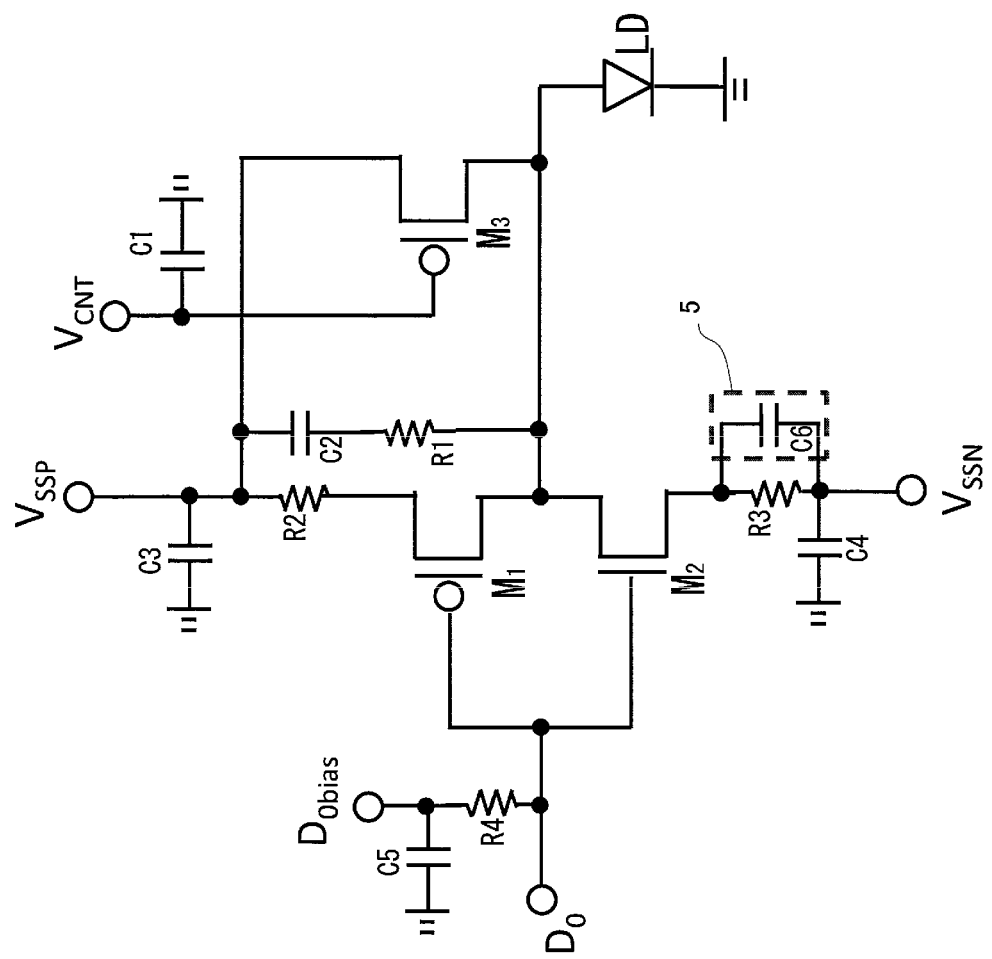
FIG. 3 is a diagram illustrating an example of further providing a fifth circuit for the structure shown in FIG. 2.

While not shown in FIG. 2, connection of a capacitor C6 to the resistor R3 in parallel as a fifth circuit 5 as shown in FIG. 3 can improve frequency characteristics of the DML driver 101B.

Embodiment 3

Figure 4:
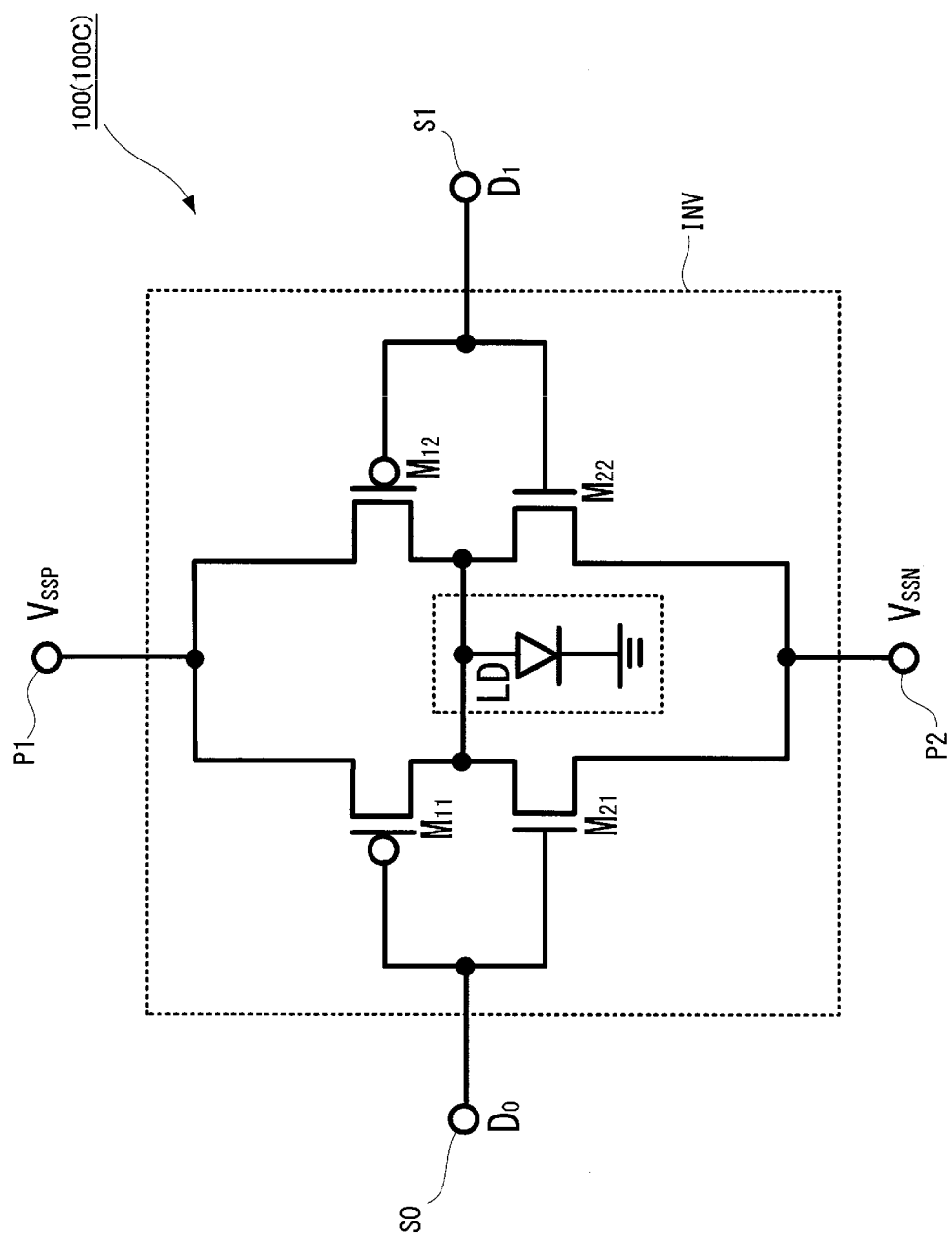
FIG. 4 is a diagram showing the structure of a principal part of a transmitter front-end using a DML driver according to Embodiment 3 of the present invention.

FIG. 4 shows the structure of a principal part of a transmitter front-end (PAM4 transmitter front-end) using a DML driver according to Embodiment 3 of the present invention. In this transmitter front-end 100C of Embodiment 3, the structure of the CMOS inverter circuit INV in the transmitter front-end 100A shown in FIG. 1 is changed to the structure of bilaterally arranging two CMOS inverter circuits INV symmetrically across the laser diode LD.

In FIG. 4, branch numbers "1", "2" are respectively added to corresponding signs of the structures corresponding to those in the DML driver 101A in the transmitter front-end 100A, to represent the corresponding structures. S0 and S1 are each signal input terminals of LSB and MSB.

In this transmitter front-end 100C, the CMOS inverter circuit INV includes a PMOSFET•$M_{11}$, a PMOSFET•$M_{12}$, a NMOSFET•$M_{21}$, and a NMOSFET•$M_{22}$. A gate of the PMOSFET•$M_{11}$ and a gate of the NMOSFET•$M_{21}$ are connected to the signal input terminal S0, and a gate of the PMOSFET•$M_{12}$ and a gate of the NMOSFET•$M_{22}$ are connected to the signal input terminal S1. A source of the PMOSFET, $M_{11}$ and a source of the PMOSFET•$M_{12}$ are connected to the first voltage application terminal P1, and a source of the NMOSFET•$M_{21}$ and a source of the NMOSFET•$M_{22}$ are connected to the second voltage application terminal P2. A drain of the PMOSFET•$M_{11}$ and a drain of the NMOSFET•$M_{21}$, and a drain of the PMOSFET•$M_{12}$ and a drain of the NMOSFET•$M_{22}$ are connected to the anode of the laser diode LD.

In this transmitter front-end 100C, the data of "0" and "1" as digital signals $D_o$ and $D_1$ is given to the signal input terminals S0 and S1 respectively, which makes it possible to output PAM4 optical signals from the laser diode LD.

Embodiment 4

Figure 5:
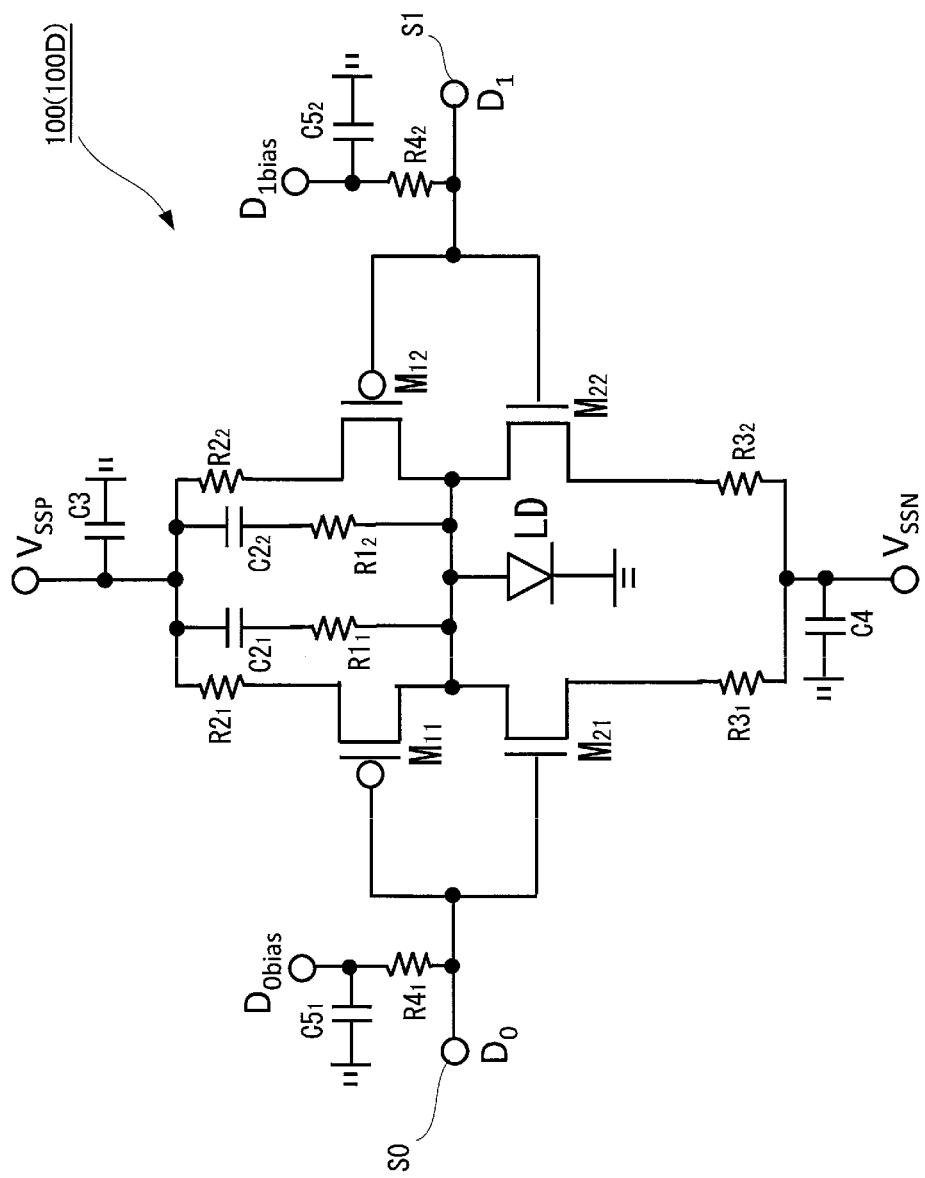
FIG. 5 is a diagram showing the structure of a principal part of a transmitter front-end using a DML driver according to Embodiment 4 of the present invention.

FIG. 5 shows the structure of a principal part of a transmitter front-end (PAM4 transmitter front-end) using a DML driver according to Embodiment 4 of the present invention. In this transmitter front-end 100D of Embodiment 4, the first circuit 1 is excluded from the transmitter front-end 100B shown in FIG. 2, and a set of the rest of the circuit structure is further added thereto.

In FIG. 5 as well, branch numbers "1", "2" are respectively added to corresponding signs of the structures corresponding to those in the DML driver 101B in the transmitter front-end 100B, to represent the corresponding structures. In this transmitter front-end 100D as well, the data of "0" and "1" as the digital signals $D_o$ and $D_1$ is given to the signal input terminals S0 and S1 respectively, which makes it possible to output PAM4 optical signals from the laser diode LD.

Figure 6:
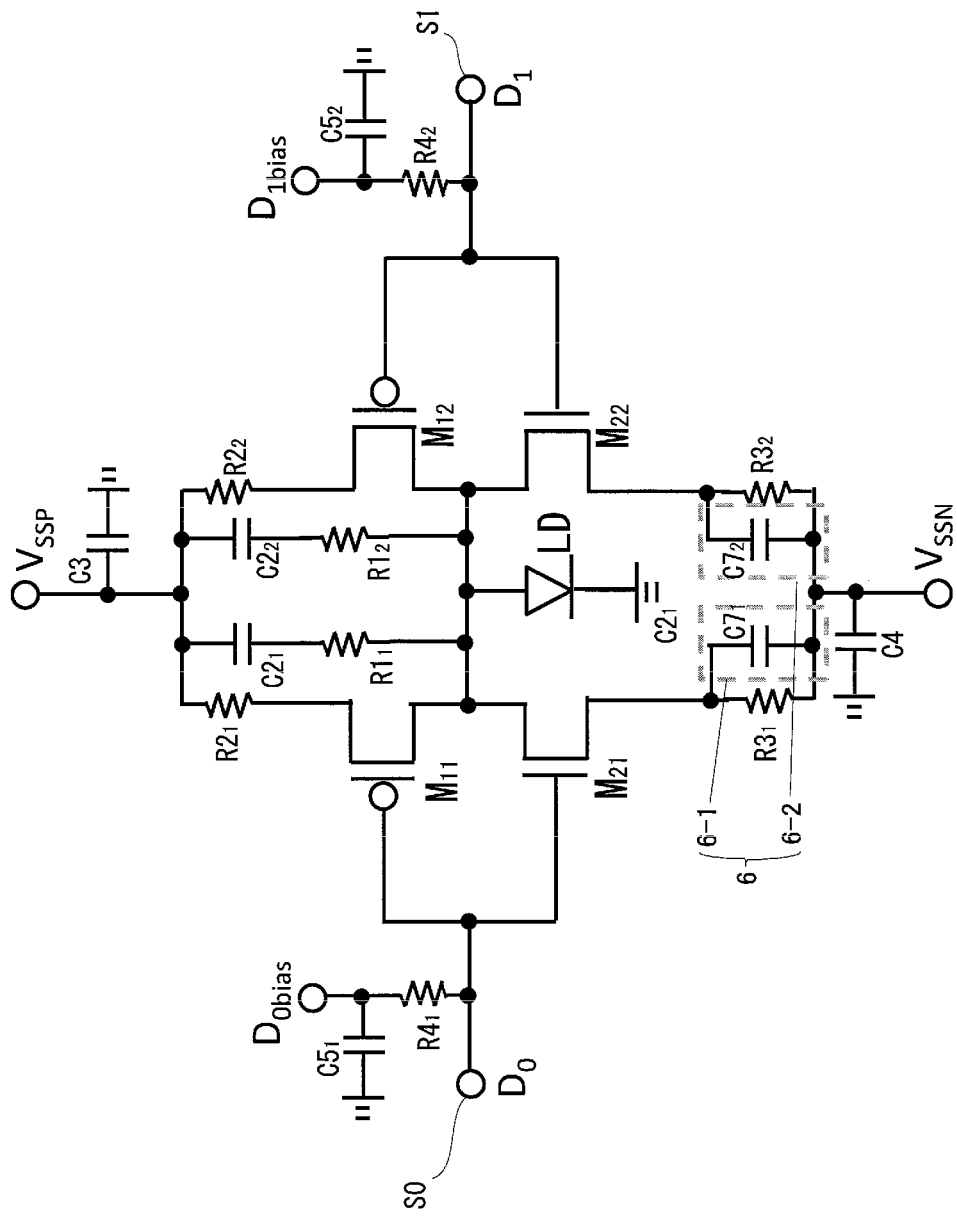
FIG. 6 is a diagram illustrating an example of further providing sixth circuits for the structure shown in FIG. 5.
Figure 7:
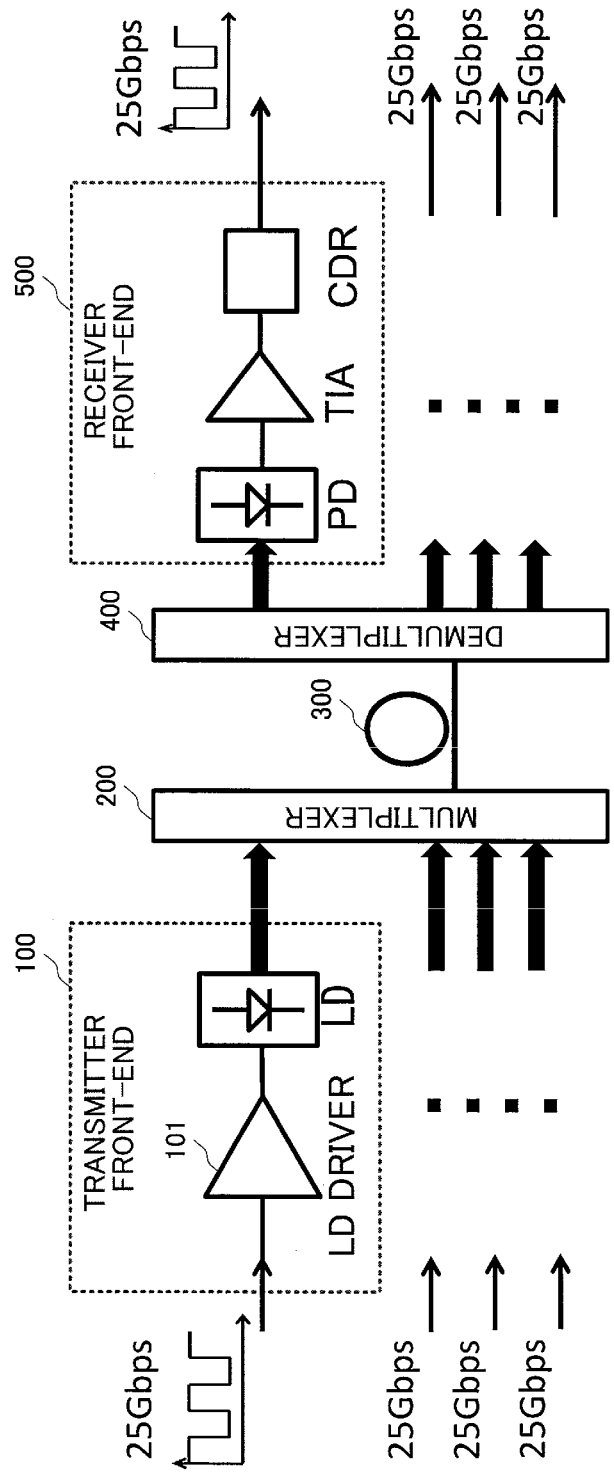
FIG. 7 is a diagram showing a schematic structure of a transmission system of "100 GBase-LR4/ER4".
Figure 8:
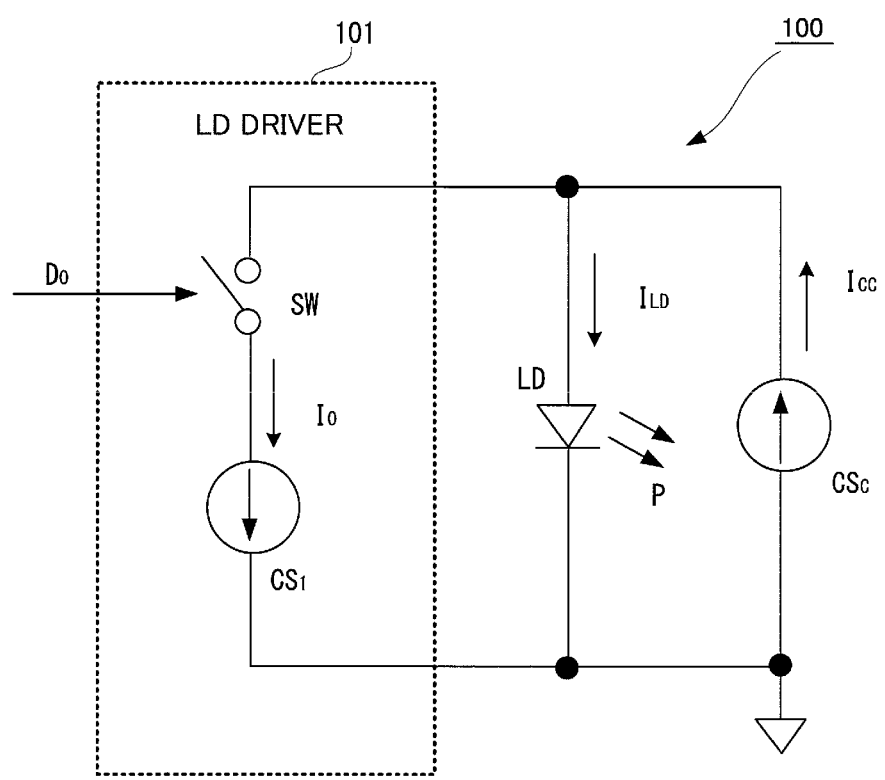
FIG. 8 is a diagram illustrating an example of the structure of a principal part of a transmitter front-end using a shunt-type LD driver.
Figure 9:
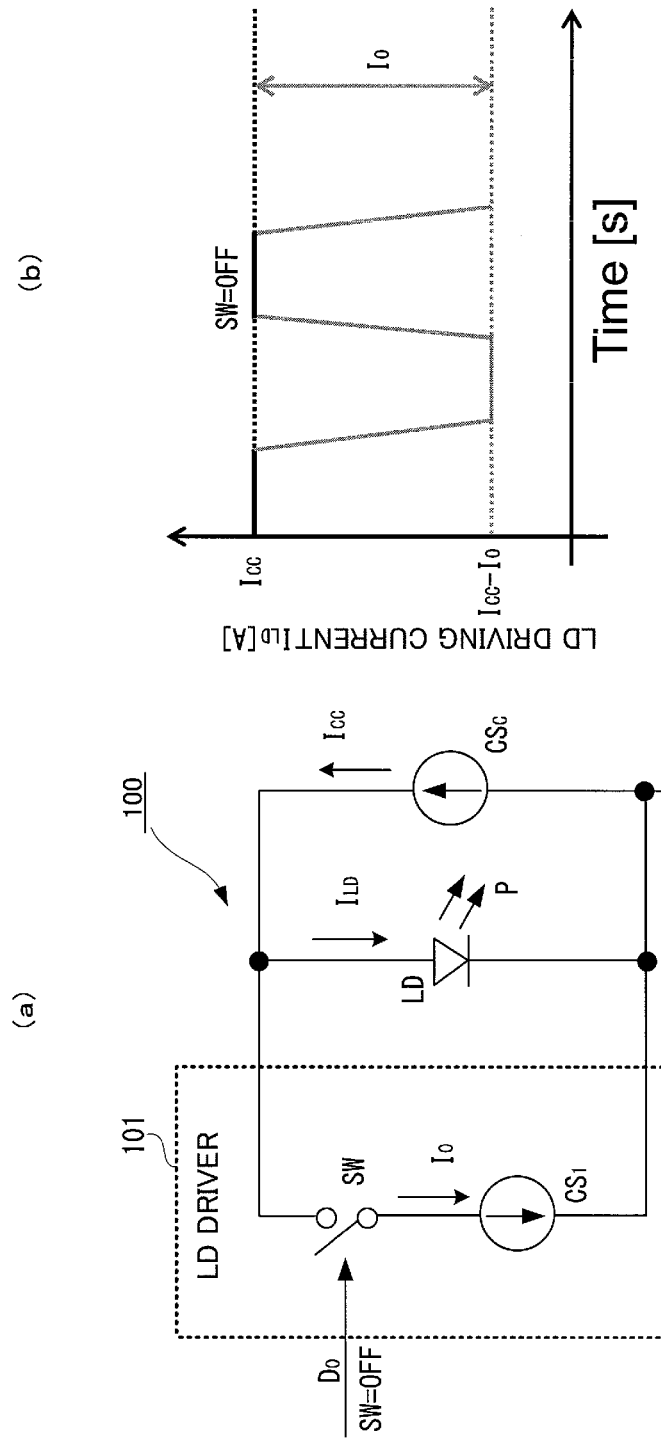
FIG. 9 are explanatory views of the OFF-operation of the transmitter front-end shown in FIG. 8.
Figure 10:
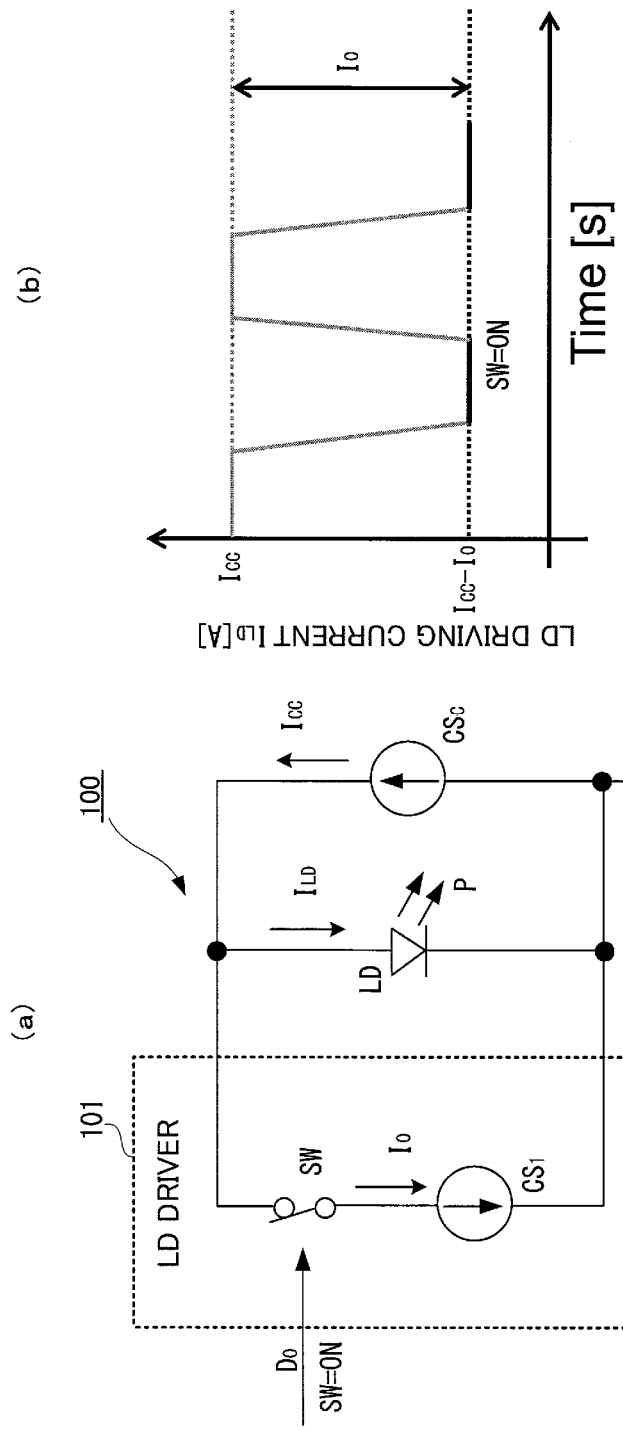
FIG. 10 are explanatory views of the ON-operation of the transmitter front-end shown in FIG. 8.

As shown in FIG. 6 as sixth circuits 6 (6-1, 6-2), connection of a capacitor $C7_1$ to a source resistor $R3_1$ of the NMOSFFET•$M_{21}$, which is on the side of giving the digital signal $D_o$, in parallel, and connection of a capacitor $C7_2$ to a source resistor $R3_2$ of the NMOSFFET•$M_{22}$, which is on the side of giving the digital signal $D_1$, in parallel can improve frequency characteristics of the driver.

Extension of Embodiments

The present invention has been described as the foregoing with reference to the embodiments. The present invention is not limited to the foregoing embodiments. Various modifications that can be understood by the person skilled in the art may be performed on the structures and details of the present invention within the scope of the technical concept of the present invention.

REFERENCE SIGNS LIST

100 Transmitter front-end
101 DML driver
LD Laser diode
INV CMOS inverter circuit
$M_1$, $M_3$ PMOSFET
$M_2$ NMOSFET
S0, S1 Signal input terminal
P1 First voltage application terminal
P2 Second voltage application terminal
P3 Third voltage application terminal
P4 Fourth voltage application terminal
1 First circuit
2 Second circuit
3 Third circuit
4 Fourth circuit
5 Fifth circuit
6 Sixth circuit
L1 to L6 Connection line
R1 to R4 Resistor
C1 to C6 Capacitor

The invention claimed is:

1. A DML driver comprising:
a CMOS inverter circuit modulating current flowing into a laser diode on the basis of a digital signal, wherein a current flowing into the laser diode is modulated on the basis of a level change in a voltage input as the digital signal;
a signal input terminal where the digital signal is input;
a first voltage application terminal where a first DC voltage is applied;
a second voltage application terminal where a second DC voltage is applied, the second DC voltage being lower than the first DC voltage; and
wherein the CMOS inverter circuit comprises:
a first PMOSFET; and
a first NMOSFET, wherein a gate of the first PMOSFET and a gate of the first NMOSFET are connected to the signal input terminal, a source of the first PMOSFET is connected to the first voltage application terminal, a source of the first NMOSFET is connected to the second voltage application terminal, and a drain of the first PMOSFET and a drain of the first NMOSFET are connected to the laser diode.

2. The DML driver according to claim 1, further comprising:
a third voltage application terminal where a third DC voltage is applied;
a second PMOSFET having:
a gate connected to the third voltage application terminal;
a source connected to a first connection line, the first connection line is connected to the source of the first PMOSFET and the first voltage application terminal; and
a drain connected to an anode of the laser diode; and
a first capacitor connected between a grounded line and a second connection line, the second connection line is connected to the third voltage application terminal and the gate of the second PMOSFET.

3. The DML driver according to claim 1, further comprising:
a series-connected circuit of a first resistor and a second capacitor, the series-connected circuit linking a third connection line to a fourth connection line, the third connection line is connected to the drain of the first PMOSFET, the drain of the first NMOSFET, and an anode of the laser diode, and the fourth connection line is connected to the source of the first PMOSFET and the first voltage application terminal.

4. The DML driver according to claim 1, further comprising:
a fourth voltage application terminal where a fourth DC voltage is applied;
a fourth resistor connected between the fourth voltage application terminal and a fifth connection line, the fifth connection line is connected to the gate of the first PMOSFET, the gate of the first NMOSFET, and the signal input terminal; and
a fifth capacitor connected between a grounded line and a sixth connection line, the sixth connection line is connected to the fourth voltage application terminal and the fourth resistor.

5. The DML driver according to claim 1, comprising:
a second resistor connected between the source of the first PMOSFET and the first voltage application terminal;
a third capacitor connected between a grounded line and a seventh connection line, the seventh connection line is connected to the first voltage application terminal and the second resistor;
a third resistor connected between the source of the first NMOSFET and the second voltage application terminal; and
a fourth capacitor connected between a grounded line and a eighth connection line, the eighth connection line is connected to the second voltage application terminal and the third resistor.

6. The DML driver according to claim 5, comprising: a sixth capacitor that is connected to the third resistor in parallel.

7. The DML driver according to claim 1, further comprising:
a first signal input terminal where a first digital signal is input;
a second signal input terminal where a second digital signal is input;
a first voltage application terminal where a first DC voltage is applied;
a second voltage application terminal where a second DC voltage is applied, the second DC voltage being lower than the first DC voltage; and
wherein the CMOS inverter circuit comprises:
a first PMOSFET;
a second PMOSFET;
a first NMOSFET; and
a second NMOSFET, wherein a gate of the first PMOSFET and a gate of the first NMOSFET are connected to the first signal input terminal, a gate of the second PMOSFET and a gate of the second NMOSFET are connected to the second signal input terminal, a source of the first PMOSFET and a source of the second PMOSFET are connected to the first voltage application terminal, a source of the first NMOSFET and a source of the second NMOSFET are connected to the second voltage application terminal, and a drain of the first PMOSFET, a drain of the first NMOSFET, a drain of the second PMOSFET, and a drain of the second NMOSFET are connected to an anode of the laser diode.

8. A DML driver comprising:
a first signal input terminal where a first digital signal is input;
a second signal input terminal where a second digital signal is input;
a first voltage application terminal where a first DC voltage is applied;
a second voltage application terminal where a second DC voltage is applied, the second DC voltage being lower than the first DC voltage; and
a CMOS inverter circuit comprising:
a first PMOSFET;
a second PMOSFET;
a first NMOSFET; and
a second NMOSFET, wherein a gate of the first PMOSFET and a gate of the first NMOSFET are connected to the first signal input terminal, a gate of the second PMOSFET and a gate of the second NMOSFET are connected to the second signal input terminal, a source of the first PMOSFET and a source of the second PMOSFET are connected to the first voltage application terminal, a source of the first NMOSFET and a source of the second NMOSFET are connected to the second voltage application terminal, and a drain of the first PMOSFET, a drain of the first NMOSFET, a drain of the second PMOSFET, and a drain of the second NMOSFET are connected to an anode of a laser diode.

9. The DML driver according to claim 8, wherein the CMOS inverter circuit modulates current flowing into the laser diode on the basis of a level change in a voltage input as a digital signal.

10. A DML driver comprising:
a signal input terminal where a digital signal is input;
a first voltage application terminal where a first DC voltage is applied;
a second voltage application terminal where a second DC voltage is applied, the second DC voltage being lower than the first DC voltage; and
a CMOS inverter circuit comprising:
a first PMOSFET; and
a first NMOSFET, wherein a gate of the first PMOSFET and a gate of the first NMOSFET are connected to the signal input terminal, a source of the first PMOSFET is connected to the first voltage application terminal, a source of the first NMOSFET is connected to the second voltage application terminal, and a drain of the first PMOSFET and a drain of the first NMOSFET are connected to an anode of a laser diode.

11. The DML driver according to claim 10, wherein the CMOS inverter circuit modulates current flowing into the laser diode on the basis of a level change in a voltage input as the digital signal.

* * * * *